(12) United States Patent
Wolrich et al.

(10) Patent No.: US 6,694,380 B1
(45) Date of Patent: Feb. 17, 2004

(54) MAPPING REQUESTS FROM A PROCESSING UNIT THAT USES MEMORY-MAPPED INPUT-OUTPUT SPACE

(75) Inventors: Gilbert Wolrich, Framingham, MA (US); Debra Bernstein, Sudbury, MA (US); Daniel Cutter, Townsend, MA (US); Christopher Dolan, Milford, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,271

(22) Filed: Dec. 27, 1999

(51) Int. Cl.[7] ............................................... G06F 13/00

(52) U.S. Cl. .................. 710/5; 710/7; 710/11; 710/20; 710/306

(58) Field of Search ........................... 710/5, 7, 11, 20, 710/306

(56) References Cited

U.S. PATENT DOCUMENTS

| | | | |
|---|---|---|---|
| 5,142,683 A | * 8/1992 | Burkhardt, Jr. et al. | 709/215 |
| 5,168,555 A | * 12/1992 | Byers et al. | 713/2 |
| 5,404,464 A | * 4/1995 | Bennett | 710/306 |
| 5,613,071 A | * 3/1997 | Rankin et al. | 707/10 |
| 5,717,898 A | 2/1998 | Kagan et al. | |
| 5,835,755 A | * 11/1998 | Stellwagen, Jr. | 707/3 |

* cited by examiner

Primary Examiner—Jeffrey Gaffin
Assistant Examiner—Mohammad O. Farooq
(74) Attorney, Agent, or Firm—Fish & Richardson P.C.

(57) ABSTRACT

A processor is disclosed that can map a request from a central processing unit that uses memory-mapped input-output space to a second processing domain, such as a multithreaded processing domain. A request addressed to the input-output space of the central processing unit is converted to a corresponding command that simulates an operation between components in the multithreaded processing domain. The command is executed in the multithreaded processing domain. Information is accessed according to the request in response to executing the command.

27 Claims, 8 Drawing Sheets

ADDRESS SPACE
(Hexadecimal)

| | |
|---|---|
| FFFF FFFF | |
| E7FF FFFF | |
| E000 0000 | |
| C000 0000 | SDRAM |
| B000 0000 | TRANSLATION UNIT 30 |
| A000 0000 | PCI CONFIG |
| 9000 0000 | SYSTEM |
| 8000 0000 | MAC & SRAM CONTROL REGISTERS |
| 4000 0000 | PCI UNIT |
| 0000 0000 | SRAM |

| Hexadecimal | Mapped Addresses | XXXX (Binary) |
|---|---|---|
| B004 XXXX | FBUS Interface (28) Scratchpad (110) | 0100 xxxx xxxx xxxx |
| B004 XXXX | FBUS Interface (28) Registers (108) | 0000 xxxx xxxx xxxx |
| B000 XXXX | Micro-engine (22a) Registers (78, 80) | 0110 1xxx xxxx xxxx |
| | Micro-engine (22b) Registers (78, 80) | 0110 0xxx xxxx xxxx |
| | Micro-engine (22c) Registers (78, 80) | 0001 1xxx xxxx xxxx |
| | Micro-engine (22d) Registers (78, 70) | 0001 0xxx xxxx xxxx |
| | Micro-engine (22e) Registers (78, 80) | 0000 1xxx xxxx xxxx |
| | Micro-engine (22f) Registers (78, 80) | 0000 0xxx xxxx xxxx |
| B000 XXXX | Micro-engine (22a) Registers (76b) | 0010 1xxx xxxx xxxx |
| | Micro-engine (22b) Registers (76b) | 1101 0xxx xxxx xxxx |
| | Micro-engine (22c) Registers (76b) | 0001 1xxx xxxx xxxx |
| | Micro-engine (22d) Registers (76b) | 0001 0xxx xxxx xxxx |
| | Micro-engine (22e) Registers (76b) | 0000 1xxx xxxx xxxx |
| | Micro-engine (22f) Registers (76b) | 0000 0xxx xxxx xxxx |

FIG. 4

220 — CPU 20 sends a WRITE command to the address space of a particular register in one of micro-engines 22

222 — Translation unit 30 latches the address and command type from the bus 32 and translates the address and the WRITE command to a corresponding command in a format used by the push engine 122

224 — Translation unit 30 uses the sideband command bus 134 to pass the translated command to the command interface 144 for the push engine 122

226 — Command interface 144 passes the translated command to the push engine 122

228 — Push engine 122 executes the command

230 — Push engine 122 asserts control signal (wr_to_push_data)

232 — Push engine 122 asserts address signals on address bus (Sbus_push_addr) 34C to enable the micro-engine 22 specified by the original WRITE command to accept the data on the Sbus_push_data bus 34B

FIG. 6

240     CPU 20 sends a READ command to the address space of the particular destination in the FBUS interface 242     Translation unit 30 latches the address and command type from the bus 32 and translates the address and READ command to a corresponding command in a format that simulates the format used by the push engine 122

244     Translation unit 30 uses the sideband command bus 134 to pass the translated command to the command interface 144 which passes the translated command to the push engine 246     Push engine 122 executes the READ command to place the data from the FBUS interface destination that was specified in the READ command onto the Sbus-Push_data bus 34B 248     Push engine 122 asserts control signal (rd_from_push _data) on the bus 136

250     Translation unit 30 promotes the data from the bus 34B to the core processor bus 32 so that the data can be received by the CPU 20

FIG. 7

260     CPU 20 sends a READ command to the address space of the particular register in one of the micro-engines 22

262     Translation unit 30 latches the address and command type from the bus 23 and translates the address and the READ command to a corresponding command in a format used by the pull engine 120

264     Translation unit 30 uses the sideband command bus 134 to pass the translated command to the command interface 140

266     Command interface 140 passes the translated READ command to the pull engine 120

268     Pull engine 120 executes the command so that the data from the micro-engine register specified in the READ command is placed on the Sbus_pull_data bus 34A 270     Pull engine 120 asserts control signal (rd_from_pull_data) which is sent to the translation unit 30 via the control bus 136

272     Translation unit 30 promotes the data from the bus 34A to the core processor bus 32 so that the data can be received by the CPU 20

FIG. 8

MAPPING REQUESTS FROM A PROCESSING UNIT THAT USES MEMORY-MAPPED INPUT-OUTPUT SPACE

BACKGROUND OF THE INVENTION

This invention relates to parallel processors.

Parallel processing is an efficient form of information processing of concurrent events in a computing process. Parallel processing demands concurrent execution of many programs in a computer, in contrast to sequential processing. In the context of a parallel processor, parallelism involves doing more than one function at the same time. Unlike a serial paradigm in which all tasks are performed sequentially at a single station or a pipelined machine where tasks are performed at specialized stations, with parallel processing, multiple stations are provided with each station capable of performing all tasks. That is, in general, all or some of the stations work simultaneously and independently on the same or common elements of a problem. Certain problems are suitable for solution by applying parallel processing.

SUMMARY OF THE INVENTION

A processor is disclosed that can map a request from a central processing unit that uses memory-mapped input-output space to a second processing domain. In general, a request addressed to the input-output space of the central processing unit is converted to a corresponding command that simulates an operation between components in the second processing domain. The command is executed in the second processing domain. Information is accessed according to the request in response to executing the command.

Various features and advantages will be readily apparent from the following detailed description, the drawings, and the claims.

BRIEF DESCRIPTION OF THE DRAWINGS

FIG. 4 illustrates an exemplary address space map for the CPU.

FIG. 6 is a flow chart illustrating a method of writing data from the CPU to a register in one of the micro-engines.

FIG. 7 is a flow chart illustrating a method of the CPU reading data from a destination in the FIFO bus interface.

FIG. 8 is a flow chart illustrating a method of the CPU reading data from a register in one of the micro-engines.

DESCRIPTION OF THE PREFERRED EMBODIMENTS

Figure 1:
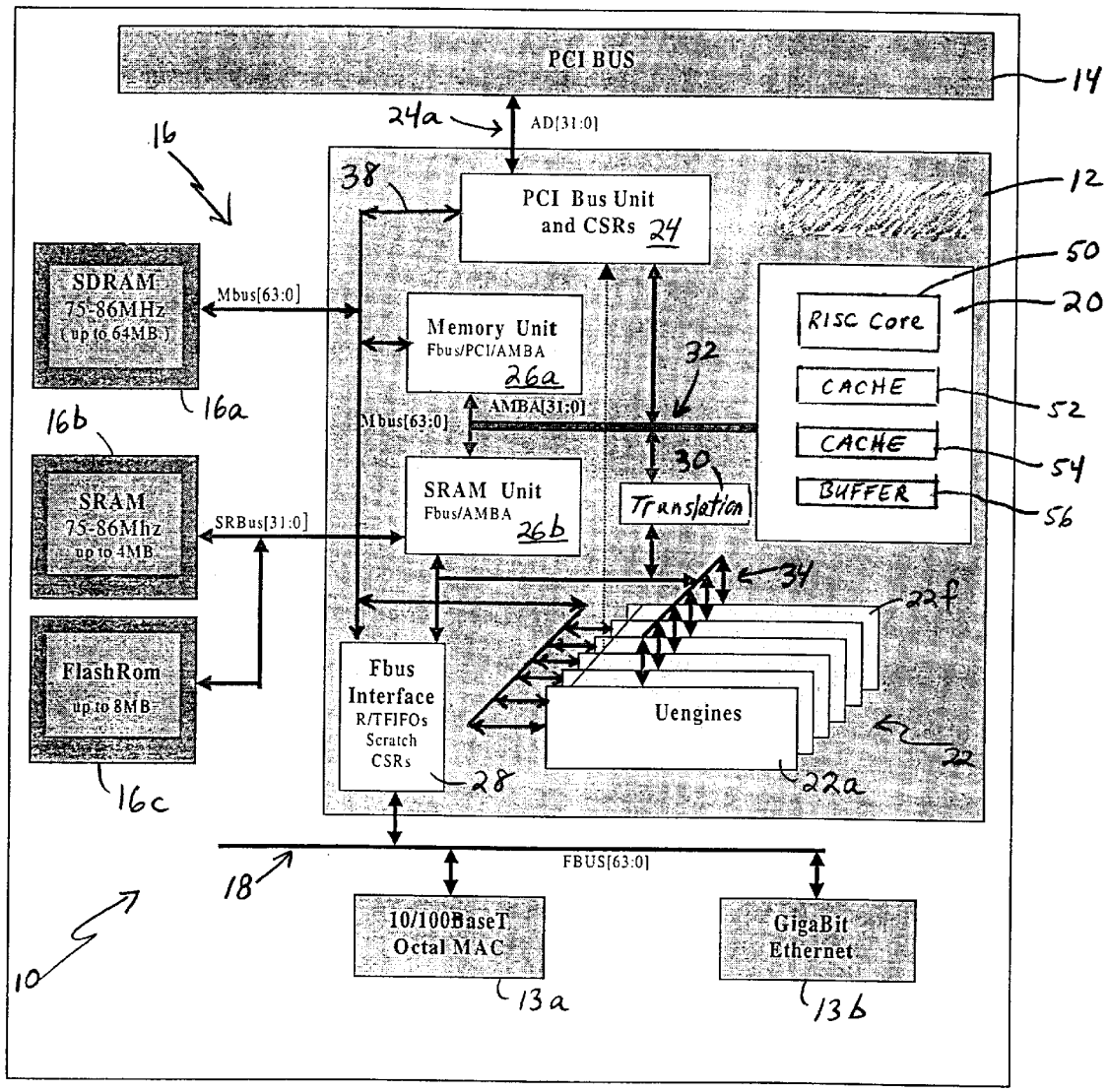
FIG. 1 is a block diagram of a communication system employing a hardware-based multithreaded processor.

Referring to FIG. 1, a communication system 10 includes a parallel, hardware-based multithreaded processor 12. The hardware-based multithreaded processor 12 is coupled to a bus such as a Peripheral Component Interconnect (PCI) bus 14, a memory system 16 and a second bus 18. The system 10 is especially suited for tasks that can be broken into parallel sub-tasks or functions. Specifically, multithreaded processor 12 is useful for tasks that are bandwidth oriented rather than latency oriented. The multithreaded processor 12 has multiple micro-coded processing engines (micro-engines) 22 each with multiple hardware controlled threads that can be simultaneously active and can independently work on a task.

The multithreaded processor 12 includes a central processing unit (CPU) 20 that assists in loading micro-code control for other resources of the multithreaded processor 12 and performs other general purpose computer-type functions such as handling protocols, exceptions, extra support for packet processing where the micro-engines pass the packets off for more detailed processing such as in boundary conditions. The CPU 20 can be implemented, for example, as a general purpose processor. In one embodiment, the CPU 20 is a Strong Arm® (Arm is a trademark of ARM Limited, United Kingdom) based architecture. The CPU 20 has an operating system through which the CPU can call functions to operate on the micro-engines 22a–22f. The CPU 20 can use any supported operating system and preferably uses a real time operating system. For the CPU implemented as a Strong Arm architecture, operating systems such as, MicrosoftNT real-time, VXWorks and uCUS, a freeware operating system available over the Internet, can be used.

The central processing unit (CPU) 20 includes a processor that uses memory-mapped input-output (I/O) space. For example, in one implementation, the CPU 20 includes a reduced instruction set computer (RISC) engine 50 (FIG. 1) that can be implemented in a five-stage pipeline that performs a single cycle shift of one operand or two operands in a single cycle and provides multiplication support and 32-bit barrel shift support. The RISC engine 50 can have a standard Strong Arm® architecture but it is implemented with a five-stage pipeline for performance reasons. The CPU 20 also includes a 16-kilobyte instruction cache 52, an 8-kilobyte data cache 54 and a pre-fetch stream buffer 56. The CPU 20 performs arithmetic operations in parallel with memory write operations and instruction fetches. The CPU 20 interfaces with other functional units via the 32-bit bi-directional ASB bus 32.

The memory system 16 includes a Synchronous Dynamic Random Access Memory (SDRAM) controller 26a and a Synchronous Random Access Memory (SRAM) controller 26b. SDRAM memory 16a and SDRAM controller 26a are typically used for processing large volumes of data, for example, processing network payloads from network packets. SRAM memory 16b and SRAM controller 26b are used in a networking implementation for low latency, fast access tasks, for example, accessing look-up tables, memory for the CPU 20, and so forth.

The CPU 20 is able to access the shared resources. For example, the CPU 20 has a direct communication to the SDRAM controller 26a, to the bus interface 24 and to the SRAM controller 26b via bus 32.

Advantages of hardware multithreading can be explained by SRAM or SDRAM memory accesses. As an example, an SRAM access requested by a Thread_0, from a micro-engine 22 will cause the SRAM controller 26b to initiate an access to the SRAM memory 16b. The SRAM controller controls arbitration for the SRAM bus, accesses the SRAM 16b, fetches the data from the SRAM 16b, and returns data to a requesting micro-engine 22a–22b. During an SRAM access, if the micro-engine, for example micro-engine 22a, had only a single thread that could operate, that micro-engine would be dormant until data was returned from the SRAM. By employing hardware context swapping within each of the micro-engines 22a–22f, the hardware context swapping enables other contexts with unique program counters to execute in that same micro-engine. Thus, another thread, for example Thread_1, can function while the first thread Thread_0 is awaiting the read data to return. During execution, Thread_1 may access the SDRAM memory 16a. While Thread_1 operates on the SDRAM unit, and Thread_0 is operating on the SRAM unit, a new thread, for example Thread_2, can now operate in the micro-engine 22a. Thread_2 can operate until it needs to access memory or perform some other long latency operation, such as making an access to a bus interface. Therefore, simultaneously, the processor 12 can have a bus operation, SRAM operation and SDRAM operation all being completed or operated upon by one micro-engine 22a and have one more thread available to process more work in the data path.

An exemplary application for the hardware-based multithreaded processor 12 is as a network processor. As a network processor, the multithreaded processor 12 serves as an interface to network devices such as a media access controller (MAC) device, for example, a 10/100BaseT Octal MAC 13a or a Gigabit Ethernet device 13b. In general, as a network processor, the multithreaded processor 12 can interface to any type of communication device or interface that receives or sends large amounts of data. When functioning in a networking application, the communication system 10 can receive multiple network packets from the devices 13a, 13b and process those packets in a parallel manner. With the hardware-based multithreaded processor 12, each network packet can be independently processed.

The processor 12 also can be used as a print engine for a postscript processor, as a processor for a storage subsystem, for example, RAID disk storage, or as a matching engine. In the securities industry, for example, the advent of electronic trading requires the use of electronic matching engines to match orders between buyers and sellers. These and other parallel types of tasks can be accomplished on the system 10.

The processor 12 includes a bus interface 28 that couples the processor to the second bus 18. The bus interface 28 can couple the processor 12. for example, to a first-in-first-out (FIFO) bus (FBUS) 18. The FBUS interface 28 is responsible for controlling the interface between the processor 12 and the 64-bit wide FBUS 18.

The processor 12 also includes a Peripheral Component Interconnect (PCI) bus interface 24 that can couple other system components that reside on the PCI 14 bus to the processor 12. The PCI bus interface 24 provides a high-speed data path 24a to the memory 16. Data can be moved through that path quickly from the SDRAM 16a through the PCI bus 14, via direct memory access (DMA) transfers.

Each of the functional units is coupled to one or more internal buses. The internal buses can be dual, 32-bit buses, in other words, one bus for read operations and one bus for write operations. The multithreaded processor 12 is arranged such that the sum of the bandwidths of the internal buses in the processor 12 exceeds the bandwidth of external buses coupled to the processor 12. The processor 12 includes an internal core processor bus 32, for example, an ASB bus (Advanced System Bus) that couples the CPU 20 to the memory controllers 26a, 26b and to an ASB translator 30 described below. The ASB bus 32 is a subset of the AMBA bus that is used with the processor core. The processor 12 also includes a private bus 34 that couples the micro-engine units 22 to the SRAM controller 26b, the translator 30 and the FBUS interface 28. A memory bus 38 couples the memory controllers 26a, 26b to the bus interfaces 24, 28 and memory system 16 including flash-ROM 16c used for boot operations and the like.

Micro-engines

Each micro-engine 22a–22f maintains program counters in hardware and has states associated with the program counters. Corresponding sets of threads can be simultaneously active on each of the micro-engines 22a–22f while only one is actually operating at any one time.

In one implementation, there are six micro-engines 22a–22f each of which is capable of processing four hardware threads. The micro-engines 22a–22f operate with shared resources including the memory system 16 and bus interfaces 24 and 28.

Figure 2:
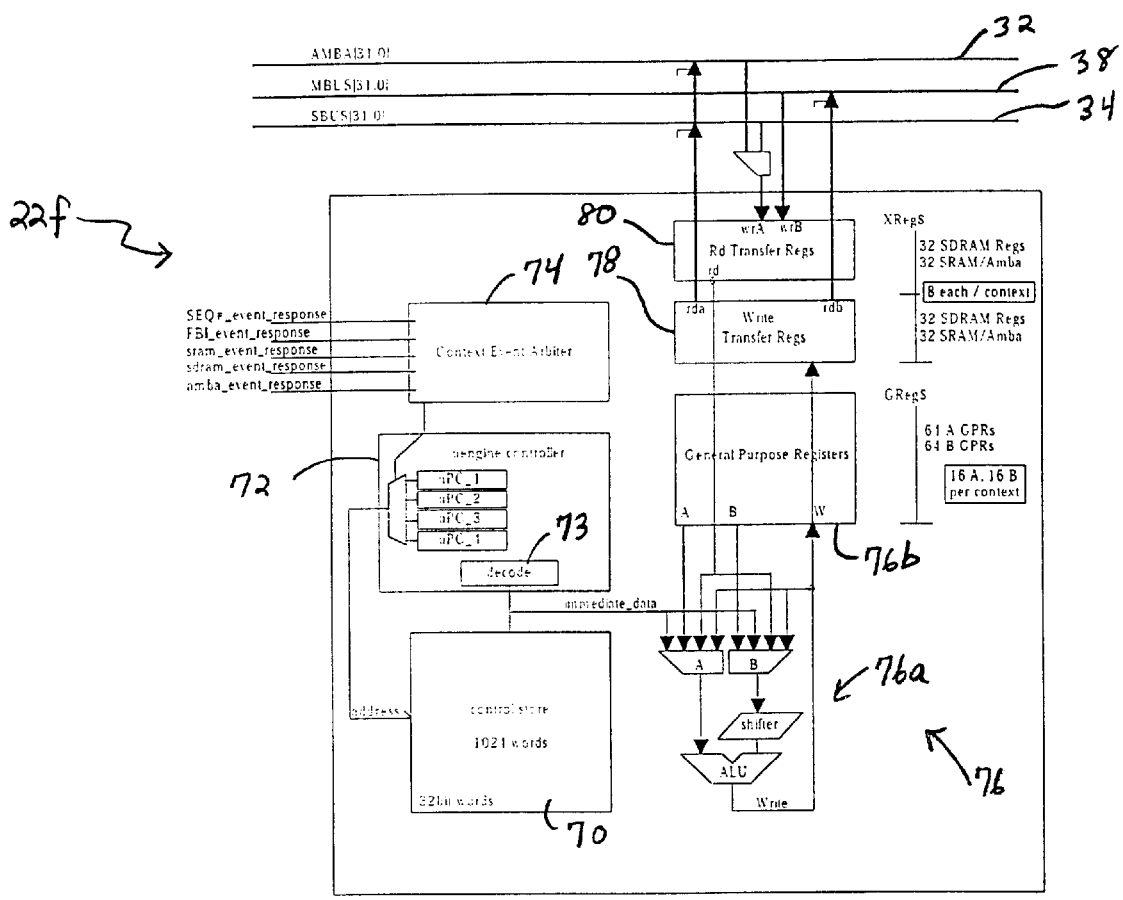
FIG. 2 is a block diagram of a micro-engine functional unit employed in the multithreaded processor of FIG. 1.

Referring to FIG. 2, an exemplary one of the micro-engines, such as micro-engine 22f, includes a control store 70 that, in one implementation, includes a random access memory (RAM) of 1,024 32-bit words. The RAM stores a micro-program that is loadable by the CPU 20. The micro-engine 22f also includes controller logic 72 that has an instruction decoder 73 and program counter (PC) units 72a–72d maintained in hardware. The micro-engine 22f includes context event switching logic 74 that receives messages from the shared resources. The messages provide information on whether a requested function has completed. The context event logic 74 includes arbitration for the four threads.

The micro-engine 22f includes an execution box data path 76 that has an arithmetic logic unit 76a and a general purpose register set 76b. The arithmetic logic unit 76a performs arithmetic and logical functions as well as shift functions. The register set 76b has a relatively large number of general purpose registers that are relatively and absolutely addressable.

The micro-engine 22f also includes a write transfer register stack 78 and a read transfer register stack 80 that are relatively and absolutely addressable. Write-data to a resource is located in the write transfer register stack 78. Similarly, the read register stack 80 is used for return data from a shared resource. Subsequent to or concurrent with data arrival, an event signal from the respective shared resource is provided to the context event switching logic 74 which alerts the thread that the data is available or has been sent.

Data functions are distributed among the micro-engines 22. Connectivity to the SRAM 26a, SDRAM 26b and FBUS interface 28 is through command requests. Command requests include memory requests FBUS requests. For example, a command request can move data from a register located in a micro-engine 22 to a shared resource, for example, an SDRAM location, SRAM location, flash memory or a MAC address. The commands are sent out to each of the functional units and the shared resources. However, the shared resources do not need to maintain local buffering of the data. Rather, the shared resources access distributed data located inside of the micro-engines. This enables the micro-engines 22a–22f to have local access to data rather than arbitrating for access on a bus and risk contention for the bus. With this feature there is a 0 cycle stall for waiting for data internal to the micro-engines 22a–22f.

FBUS Interface (FBI)

Figure 3:
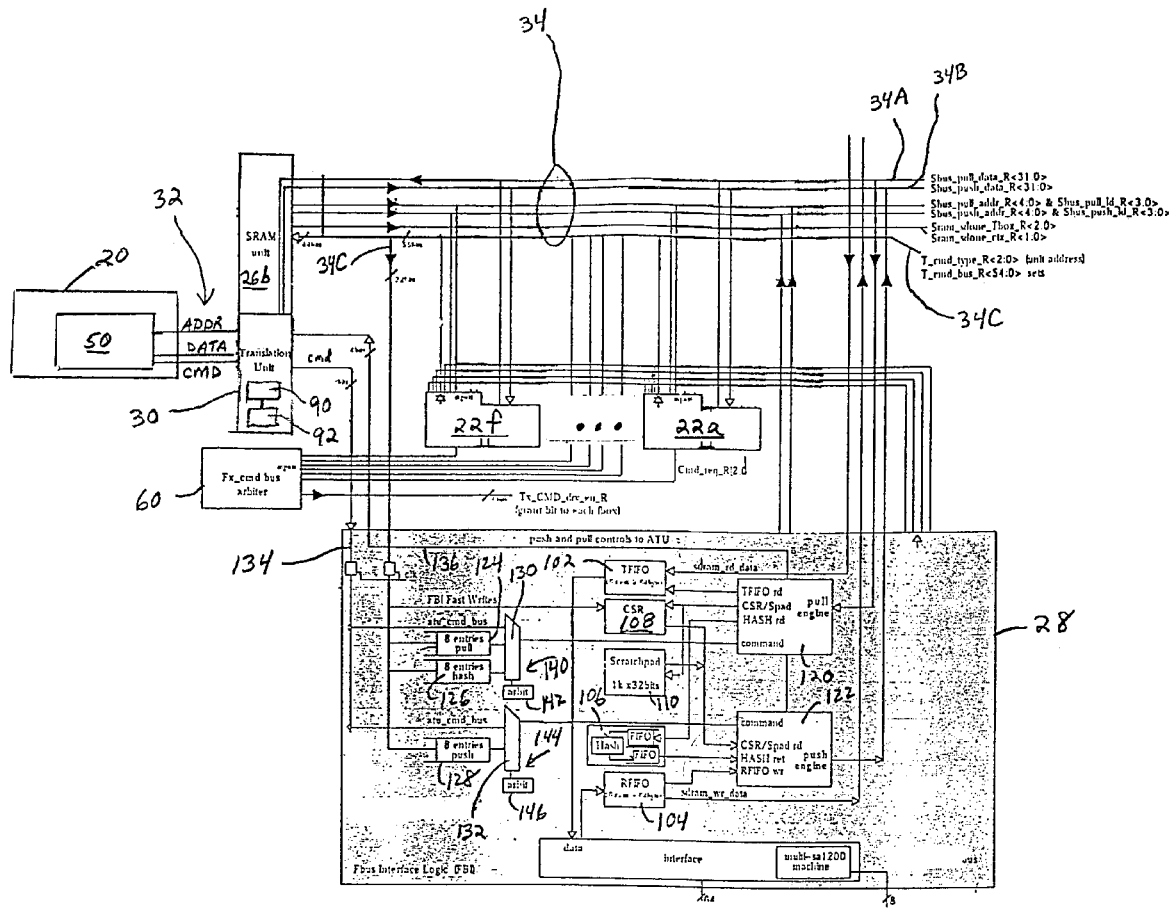
FIG. 3 is a block diagram illustrating interface units used for converting CPU commands directed to the I/O memory space address of micro-engines or a bus interface unit.

Referring to FIG. 3, the FBUS interface 28 contains a transmit FIFO 102, a receive FIFO 104, a HASH unit 106 and control and status registers 108. The FBUS interface 28 also includes a scratchpad memory 110.

The FBUS interface 28 has a push engine 120 for pushing data into the transfer registers 78, 80 during the cycles when the SRAM is not using the SRAM data bus. The FBUS interface 28 also includes a pull engine 122 for retrieving data from the transfer registers 78, 80 in the micro-engines 22. The engines 120, 122 are implemented within the FBUS interface control logic.

In general, data transfers between the FBUS interface 28a and the micro-engines 22 are accomplished over the bus 34 via the transfer registers 78, 80 in the micro-engines and the push and pull engines 120, 122 in the FBUS interface 28. As previously mentioned, in some implementations, the bus 34 includes two data buses each of which is unidirectional. One bus (Sbus_pull_data) 34A is used for transferring data into the FBUS interface 28 and another bus (Sbus_push_data) 34B is used for returning data to the micro-engines 22. The buses 34A, 34B use control signals that provide read/write control to the appropriate transfer registers 78, 80 in one of the micro-engines 22.

A global command arbiter 60 enables commands from the micro-engines 22 to be driven onto a command bus 34C. The various units in the. FBUS interface 28 communicate with the micro-engines 22 through time-multiplexed access to the bus 34. A command from a micro-engine 22 involving the FBUS interface 28 is loaded into a one of several queues: a pull command queue 124, a hash command queue 126 or a push command queue 128. Commands in the pull and hash queues 124, 126 then can be passed to the pull engine 120 via a multiplexer 130. Similarly, commands in the push queue 128 can be passed to the push engine 132 via a multiplexer 132.

References from the CPU 20 to the registers 78, 80 in the micro-engines 22 as well as to the registers 108 or scratchpad 110 in the FBUS interface 28 are mapped in the input/output (I/O) space of the CPU. An exemplary mapping of the I/O space of the CPU 20 is illustrated in FIG. 4.

Translation Unit

Still referring to FIG. 3, the translation unit 30 converts address space requests from the CPU 20 into commands that simulate operations between the micro-engines 22 and the FBUS interface unit 28 with the core processor bus 32 acting as either the source or destination of the data. For example, the translation unit 30 performs address translations between micro-engine transfer register locations and CPU addresses so that the CPU 20 can access registers belonging to the micro-engines 22. READ and WRITE operations from the core processor bus 32 to the micro-engines 22 appear to the micro-engines like operations from the FBUS interface 28.

The translation unit 30 also performs address translations between FBUS interface register locations and CPU addresses so that the CPU 20 can access registers in the FBUS interface 28. Similarly, the translation unit 30 performs address translations between the FBUS scratchpad location and a corresponding CPU address so that the CPU 20 can access the scratchpad 110. When the CPU 20 performs a READ or WRITE operation with respect to a destination in the FBUS interface 28, the translation unit 30 appears to the FBUS interface as simply another micro-engine 22 with one read transfer register and one write transfer register.

In general, the translation unit 30 maps the CPU address and READ/WRITE signal into a command for the pull engine 120 or the push engine 122. The translation unit 30 contains hardwired sequencing logic 90 and registers 92 that respond to control signals from the pull and push engines to supply or receive the targeted data. In other implementations, the translation unit 30 can include a programmable logic array (PLA). Although the translation unit 30 can physically reside in the FBUS interface 28, it is logically distinct.

Figure 5:
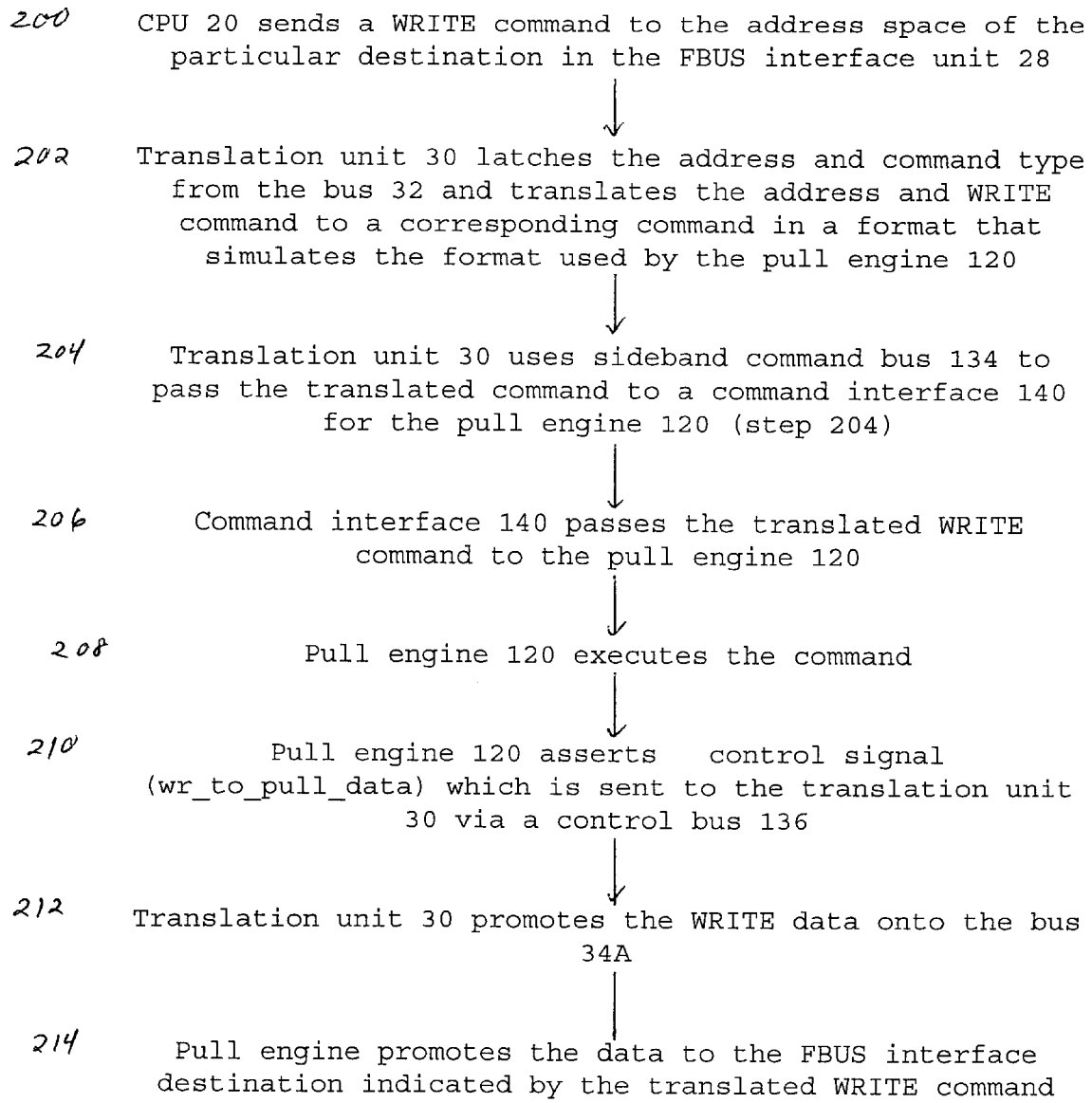
FIG. 5 is a flow chart illustrating a method of writing data from the CPU to a destination in a first-in-first-out (FIFO) bus interface.

Referring to FIG. 5, to initiated a WRITE operation from the CPU 20 to a particular destination in the FBUS interface 28, such as a control and status register 108 or the scratchpad 110, the CPU sends 200 a WRITE command to the address space of the particular register or the scratchpad. The translation unit 30 latches the address and command type from the bus 32 and translates 202 the address and the WRITE command to a corresponding command in a format that simulates the format used by the pull engine 120. A latched register in the translation unit 30 simulates a source output transfer register in one of the micro-engines 22. The translation unit 30 uses a sideband command bus 134 to pass 204 the translated command to a command interface 140 for the pull engine 120. The command interface 140 includes the multiplexer 130 and an arbiter 142 that determines the priority in which the various commands from the queues 124, 126 and the bus 134 are forwarded to the pull engine 120. In general, commands from the translation unit 30 are given priority over other commands in the queues 124, 126.

The command interface 140 passes 206 the translated WRITE command to the pull engine 120, which executes 208 the command. The pull engine 120 asserts 210 a control signal (wr_to_pull_data) that is sent to the translation unit 30 via a control bus 136. The control signal (wr_to_pull_data) serves to instruct the translation unit 30 to promote 212 the WRITE data onto the Sbus_pull_data bus 34A. Once the pull engine 120 has pulled the WRITE data from the translation unit 30, it promotes 214 the data to the FBUS interface destination indicated by the translated WRITE command.

Referring to FIG. 6, to initiate a WRITE operation from the CPU 20 to a particular register 76b, 78, 80, in one of the micro-engines 22, the CPU sends 220 a WRITE command to the address space of the particular register. The translation unit 30 latches 222 the address and command type from the bus 32 and translates the address and the WRITE command to a corresponding command in a format recognized by the push engine 122. In other words, a push command is simulated with a latched register in the translation unit 30 serving as a register 108 (or scratchpad 110) in the FBUS interface 28. The translation unit 30 uses the sideband command bus 134 to pass 224 the translated command to a command interface 144 for the push engine 122. The command interface 144 includes the multiplexer 132 and an arbiter 146 that determines the priority in which the various commands from the queue 128 and the bus 134 are forwarded to the push engine 122. In general, commands from the translation unit 30 are given priority over commands in the queue 128.

The command interface 144 passes 226 the translated command to the push engine 122 which executes 228 the command. The push engine 122 asserts 230 a control signal (wr_to_push_data) that is sent to the translation unit 30 via the control bus 136 (step 230). The control signal (wr_to_push_data) serves to instruct the translation unit 30 to promote the WRITE data onto the Sbus_push_data bus 34B. At substantially the same time, the push engine 122 asserts 232 address signals on an address bus (Sbus_push_addr) 34C to enable the micro-engine 22 specified by the original WRITE command to accept the data on the Sbus_push_data bus 34B.

Referring to FIG. 7, to initiate a READ operation with respect to a particular destination in the FBUS interface 28, such as a control and status register 108 or the scratchpad 110, the CPU 20 sends 240 a READ command to the address space of the particular FBUS interface destination. The translation unit 30 latches 242 the address and command type from the bus 32 and translates the address and READ command to a corresponding command in a format that simulates the format recognized by the push engine 122. A push command is simulated with a latched register in the translation unit 30 bus 32 serving as the destination input transfer register. The translation unit 30 uses the sideband command bus 134 to pass 244 the translated command to the command interface 144 which passes the translated command to the push engine. As previously mentioned, commands from the translation unit 30 are given priority by the arbiter 146 over commands in the queue 128.

The push engine 122 executes 246 the READ command to place the data from the FBUS interface destination that was specified in the READ command onto the Sbus-Push_ data bus 34B. At substantially the same time, the push engine 122 asserts 248 a control signal (rd_from_push_data) on the bus 136. The control signal (rd_from_push_data) serves to instruct the translation unit 30 to promote 250 the data from the bus 34B to the core processor bus 32 so that the data can be received by the CPU 20.

Referring to FIG. 8, to initiate a READ operation with respect to a particular register 76b, 78, 80 in one of the micro-engines 22, the CPU 20 sends 260 a READ command to the address space of the particular register. The translation unit 30 latches 262 the address and command type from the bus 23 and translates the address and the READ command to a corresponding command in a format recognized by the pull engine 120. In other words, a pull command is simulated with a latched register in the translation unit 30 serving as the FBUS interface destination register. The translation unit 30 uses the sideband command bus 134 to pass 264 the translated command to the command interface 140. As previously explained, the arbiter 142 gives priority to commands from the translation unit 30 over commands in the queues 124, 126.

The command interface 140 passes 266 the translated READ command to the pull engine 120 that executes 268 the command so that the data from the micro-engine register specified in the READ command is placed on the Sbus_pull_data bus 34A. At substantially the same time, the pull engine 120 asserts 270 a control signal (rd_from_pull_data) which is sent to the translation unit 30 via the control bus 136. The control signal (rd_from_pull_data) instructs the translation unit 30 to promote 272 the data from the bus 34A to the core processor bus 32 so that the data can be received by the CPU 20.

The address and command conversions performed by the translation unit 30 allow the CPU 20 to transfer, data to and from registers in the micro-engines 22 and the FBUS interface 28 using existing data buses (i.e., the bus 34) and existing control logic (i.e., the push and pull engines. 120, 122). The complexity of additional control logic as well as additional logic to arbitrate between data requests from the various sources can be avoided.

Other implementations are within the scope of the following claims.

What is claimed is:

1. A method of performing a request from a central processing unit that uses memory-mapped input-output space, the method comprising:

converting a request directed to the input-output space of the central processing unit to a corresponding command that simulates an operation between components in a second processing domain;

executing the command in the second processing domain, wherein the second processing domain comprises a multithreaded processing domain, and wherein the multithreaded domain includes micro-coded processing engines that support multiple threads, the threads are simultaneously active but only one thread is in operation at any one time; and accessing information according to the request in response to executing the command.

2. The method of claim 1, wherein each micro-coded engine, to support the multiple threads, maintains program counters in hardware and includes states associated with the program counters.

3. A method of writing information from a central processing unit that uses memory-mapped input-output space, the method comprising:

sending a request from the central processing unit to an address in the input-output space, wherein the address is associated with a destination in an bus interface unit;

converting the address and a command type associated with the request to a corresponding command having a format used for communications between an engine in the bus interface unit and one or more micro-coded processing engines, wherein the micro-coded processing engines support multiple threads, the threads are simultaneously active but only one thread is in operation at any one time;

executing the command in the engine in the bus interface unit; and writing the information to the destination in the bus interface unit in response to executing the command.

4. The method of claim 3 including:

causing a control signal to be sent from the engine in the bus interface unit; and promoting the information, in response to the control signal, onto a bus used for communications between the bus interface unit and the one or more micro-coded processing engines.

5. The method of claim 4 including giving the command a higher priority than commands from the one or more micro-coded processing engines.

6. A method of writing information from a central processing unit that uses memory-mapped input-output space, the method comprising:

sending a request from the central processing unit to an address in the input-output space, wherein the address is associated with a destination in a micro-coded processing engine;

converting the address and a command type associated with the request to a corresponding command in a format used for communications between an engine in a bus interface unit and the micro-coded processing engine, wherein micro-coded processing engine supports multiple threads, the threads are simultaneously active but only one thread is in operation at any one time;

executing the command in the engine in the bus interface unit; and writing the information to the destination in the micro-coded processing engine in response to executing the command.

7. The method of claim 6 including:

causing a control signal to be asserted by the engine in the bus interface unit; and promoting the information, in response to the control signal, onto a bus used for communications between the bus interface unit and the micro-coded processing engine.

8. The method of claim 7 including:

causing the engine in the bus interface unit to assert address signals on a bus used for communications between the bus interface unit and the micro-coded processing engine, wherein the asserted address signals enable the micro-coded processing engine to accept the information.

9. The method of claim 7 including giving the command a higher priority than commands from the micro-coded processing engine.

10. A method of providing information from a bus interface unit to a central processing unit that uses memory-mapped input-output space, the method comprising:

sending a request from the central processing unit to an address in the input-output space, wherein the address is associated with a location in the bus interface unit;

converting the address and a command type associated with the request to a corresponding command having a format used for communications between an engine in the bus interface unit and one or more micro-coded processing engines, wherein the micro-coded processing engines support multiple threads, the threads are simultaneously active but only one thread is in operation at any one time;

executing the command in the engine in the bus interface unit; and providing the information to the central processing unit in response to executing the command.

11. The method of claim 10 including:

promoting the information from the location in the bus interface unit onto a first bus used for communications between the bus interface unit and the one or more micro-coded processing engines.

12. The method of claim 11 including:

causing a control signal to be asserted by the engine in the bus interface unit; and promoting the information, in response to the control signal, from the first bus to a second bus coupled to the central processing unit.

13. The method of claim 11 including giving the command a higher priority than commands from the one or more micro-coded processing engines.

14. A method of providing information from a micro-coded processing engine to a central processing unit that uses memory-mapped input-output space, the method comprising:

sending a request from the central processing unit to an address in the input-output space, wherein the address is associated with a location in the micro-coded processing engine;

converting the address and a command type associated with the request to a corresponding command having a format used for communications between an engine in a bus interface unit and the micro-coded processing engine, wherein the micro-coded processing engine supports multiple threads, the threads are simultaneously active but only one thread is in operation at any one time;

executing the command in the engine in the bus interface unit; and providing the information to the central processing unit in response to executing the command.

15. The method of claim 14 including:

promoting the information from the location in the micro-coded processing engine onto a first bus used for communications between the bus interface unit and the micro-coded processing engine.

16. The method of claim 15 including:

causing a control signal to be asserted by the engine in the bus interface unit; and promoting the information, in response to the control signal, from the first bus to a second bus coupled to the central processing unit.

17. The method of claim 15 including giving the command a higher priority than commands from the micro-coded processing engine.

18. A parallel hardware-based multithreaded processor comprising:

a central processing unit that coordinates system functions and that uses memory-mapped input-output space;

micro-coded processing engines that support multiple threads, the threads are simultaneously active but only one thread is in operation at any one time;

a bus interface unit;

a first bus coupled to the central processing unit; and a second bus coupled to the micro-coded processing engines; and a translator unit coupled between the first bus and the second bus to convert a request that is addressed to the input-output space of the central processing unit to a corresponding command that simulates operations between the bus interface unit and the micro-coded processing units.

19. The processor of claim 18 including a command bus that couples the translator unit to the bus interface unit, wherein the bus interface unit includes a plurality of engines for causing information to be pushed or pulled onto the second bus in response to a command received from the translator unit via the command bus.

20. The processor of claim 19, wherein the bus interface unit includes a plurality of registers, and wherein information stored by a particular one of the registers is passed to the central processing unit via the second bus, the translation unit and the first bus as a result of the command being received and executed by one of the engines in the bus interface unit.

21. The processor of claim 19, wherein the bus interface unit includes a scratchpad, and wherein information stored by the scratchpad is passed to the central processing unit via the second bus, the translation unit and the first bus as a result of the command being received and executed by one of the engines in the bus interface unit.

22. The processor of claim 19, wherein the micro-engines include a plurality of registers, and wherein information stored by a particular one of the registers is passed to the central processing unit via the second bus, the translation unit and the first bus as a result of the command being received and executed by one of the engines in the bus interface unit.

23. The processor of claim 19, wherein the bus interface unit includes a plurality of registers, and wherein information addressed to the input-output space of the central processing unit is passed to a particular one of the registers via the translation unit and the second bus as a result of the command from the translation unit being received and executed by one of the engines in the bus interface unit.

24. The processor of claim 19, wherein the bus interface unit includes a scratchpad, and wherein information addressed to the input-output space of the central processing unit is written to the scratchpad via the translation unit and the second bus as a result of the command being received and executed by one of the engines in the bus interface unit.

25. The processor of claim 19, wherein the micro-engines include a plurality of registers, and wherein information addressed to the input-output space of the central processing unit is written to a particular one of the registers via the translation unit and the second bus as a result of the command being received and executed by one of the engines in the bus interface unit.

26. The processor of claim 19 including a bus for sending control signals from the bus interface unit to the translation unit, wherein the translation unit includes a plurality of registers that respond to control signals from the engines in the bus interface unit to supply targeted information onto the second bus or to receive targeted information from the second bus.

27. An article comprising a computer-readable medium which stores computer-executable instructions for causing a computer system to:

convert a request addressed to input-output space of a central processing unit to a corresponding command that simulates an operation between components in a multithreaded processing domain, wherein the multithreaded processing domain includes micro-coded processing engines that support multiple threads, the threads are simultaneously active but only one thread is in operation at any one time;

execute the command in the multithreaded processing domain; and cause information to be accessed according to the request in response to executing the command.

* * * * *